US012324336B2

(12) United States Patent
Huang et al.

(10) Patent No.: US 12,324,336 B2
(45) Date of Patent: Jun. 3, 2025

(54) DISPLAY PANEL, DISPLAY DEVICE, AND EVAPORATION DEVICE

(71) Applicant: Wuhan Tianma Micro-Electronics Co., Ltd., Wuhan (CN)

(72) Inventors: Wei Huang, Wuhan (CN); Lu Xiao, Wuhan (CN); Qin Yue, Wuhan (CN); Yangzhao Ma, Wuhan (CN); Zhongjie Zhang, Shanghai (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 587 days.

(21) Appl. No.: 17/722,083

(22) Filed: Apr. 15, 2022

(65) Prior Publication Data
US 2023/0006003 A1 Jan. 5, 2023

(30) Foreign Application Priority Data
Jul. 1, 2021 (CN) .......................... 202110749523.6

(51) Int. Cl.
*H10K 71/00* (2023.01)
*C23C 14/24* (2006.01)
*H10K 59/35* (2023.01)

(52) U.S. Cl.
CPC ........... *H10K 59/353* (2023.02); *C23C 14/24* (2013.01); *H10K 71/00* (2023.02); *H10K 59/351* (2023.02)

(58) Field of Classification Search
CPC ..... H10K 59/351; H10K 59/353; H10K 71/00
See application file for complete search history.

(56) References Cited

U.S. PATENT DOCUMENTS

2021/0359034 A1* 11/2021 Shi ..................... H10K 59/353
2022/0310710 A1* 9/2022 Hu ...................... H10K 59/352

FOREIGN PATENT DOCUMENTS

| CN | 206244866 U | 6/2017 |
|---|---|---|
| CN | 107887404 B | 4/2018 |
| CN | 111725288 A | 9/2020 |
| CN | 112802884 A | 5/2021 |

* cited by examiner

Primary Examiner — Jaehwan Oh
(74) Attorney, Agent, or Firm — Anova Law Group, PLLC

(57) ABSTRACT

A display panel, a display device, and an evaporation device are provided. The display panel includes a plurality of pixel units arranged in an array. Each pixel unit includes four first sub-pixels, two second sub-pixels, and two third sub-pixels. Centers of the two second sub-pixels and centers of the two third sub-pixels form a virtual isosceles trapezoid. The two second sub-pixels are located on both ends of a diagonal of the virtual isosceles trapezoid, and the two third sub-pixels are located on both ends of another diagonal of the virtual isosceles trapezoid. Centers of the four first sub-pixels form a virtual quadrilateral. An interior of the virtual quadrilateral includes one second sub-pixel of the two second sub-pixels, and an interior of the virtual isosceles trapezoid includes one first sub-pixel of the four first sub-pixels.

19 Claims, 18 Drawing Sheets

DISPLAY PANEL, DISPLAY DEVICE, AND EVAPORATION DEVICE

CROSS-REFERENCE TO RELATED APPLICATION

This application claims the priority of Chinese patent application No. 202110749523.6, filed on Jul. 1, 2021, the entirety of which is incorporated herein by reference.

FIELD

The present disclosure generally relates to the field of display technology and, more particularly, relates to a display panel, a display device, and an evaporation device.

BACKGROUND

An organic light-emitting diode (OLED) display panel is featured with advantages of bendable, substantially thin, and substantially high luminous brightness, and has become one of the current mainstream display panels.

SUMMARY

One aspect of the present disclosure provides a display panel. The display panel includes a plurality of pixel units arranged in an array. Each pixel unit includes four first sub-pixels, two second sub-pixels, and two third sub-pixels. Centers of the two second sub-pixels and centers of the two third sub-pixels form a virtual isosceles trapezoid. The two second sub-pixels are located on both ends of a diagonal of the virtual isosceles trapezoid, and the two third sub-pixels are located on both ends of another diagonal of the virtual isosceles trapezoid. Centers of the four first sub-pixels form a virtual quadrilateral. An interior of the virtual quadrilateral includes one second sub-pixel of the two second sub-pixels, and an interior of the virtual isosceles trapezoid includes one first sub-pixel of the four first sub-pixels.

Another aspect of the present disclosure provides a display device. The display device includes a display panel. The display panel includes a plurality of pixel units arranged in an array. Each pixel unit includes four first sub-pixels, two second sub-pixels, and two third sub-pixels. Centers of the two second sub-pixels and centers of the two third sub-pixels form a virtual isosceles trapezoid. The two second sub-pixels are located on both ends of a diagonal of the virtual isosceles trapezoid, and the two third sub-pixels are located on both ends of another diagonal of the virtual isosceles trapezoid. Centers of the four first sub-pixels form a virtual quadrilateral. An interior of the virtual quadrilateral includes one second sub-pixel of the two second sub-pixels, and an interior of the virtual isosceles trapezoid includes one first sub-pixel of the four first sub-pixels.

Another aspect of the present disclosure provides an evaporation device. The evaporation device includes an evaporation source. The evaporation source includes a plurality of evaporation holes arranged in sequence along a third direction, and a first angle plate and a second angle plate arranged on both sides of the evaporation source along a fourth direction. The third direction is perpendicular to the fourth direction, and the evaporation source moves along the fourth direction to perform a vapor deposition on a display panel. The display panel includes a plurality of pixel units arranged in an array. Each pixel unit includes four first sub-pixels, two second sub-pixels, and two third sub-pixels. Centers of the two second sub-pixels and centers of the two third sub-pixels form a virtual isosceles trapezoid. The two second sub-pixels are located on both ends of a diagonal of the virtual isosceles trapezoid, and the two third sub-pixels are located on both ends of another diagonal of the virtual isosceles trapezoid. Centers of the four first sub-pixels form a virtual quadrilateral. An interior of the virtual quadrilateral includes one second sub-pixel of the two second sub-pixels, and an interior of the virtual isosceles trapezoid includes one first sub-pixel of the four first sub-pixels. The fourth direction is parallel to an upper base or a lower base of the virtual isosceles trapezoid.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

Based on the current pixel arrangement structure in the display panel, the display panel has problems such as poor text display effect, hidden lighting of a sub-pixel, and jaggedness when displaying an oblique line, etc.

Figure 1:
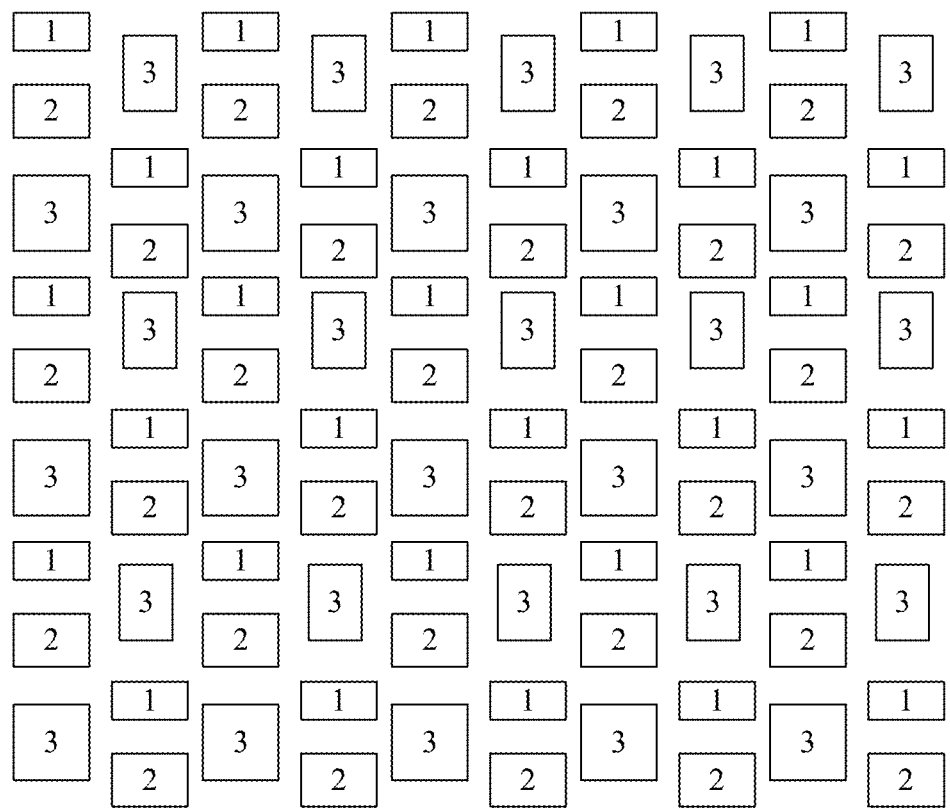
FIG. 1 illustrates a schematic diagram of a pixel arrangement structure in a display panel.

FIG. 1 illustrates a schematic diagram of a pixel arrangement structure in a display panel. Referring to FIG. 1, based on an arrangement of first sub-pixels 1, second sub-pixels 2 and third sub-pixels 3, when displaying an oblique line, a problem of jaggedness inevitably occurs, which leads to the problem of poor text display effect. The first sub-pixel 1 is a red sub-pixel, the second sub-pixel 2 is a green sub-pixel, and the third sub-pixel 3 is a blue sub-pixel.

Further, referring to FIG. 1, adjacent sub-pixels are arranged in the form of edge-to-edge, which leads to a substantially large facing area between the adjacent sub-pixels. To achieve a high pixels per inch (PPI) display panel, the distance between several adjacent sub-pixels is substantially small. Because the turn-on threshold voltage of each sub-pixel is different, when the display panel performs display, current flows laterally along a common layer between adjacent pixels, and a problem of hidden lighting of the sub-pixel will occur.

For example, a turn-on threshold voltage of the blue sub-pixel is greater than a turn-on threshold voltage of the red sub-pixel, when displaying a blue picture, the red sub-pixel tends to be lighted stealthy.

The present disclosure provides a display panel. In the disclosed display panel, a new type of pixel arrangement structure may be provided, which may greatly reduce or even solve the existing technical problems, thereby greatly improving the display effect of the display panel.

Figure 2:
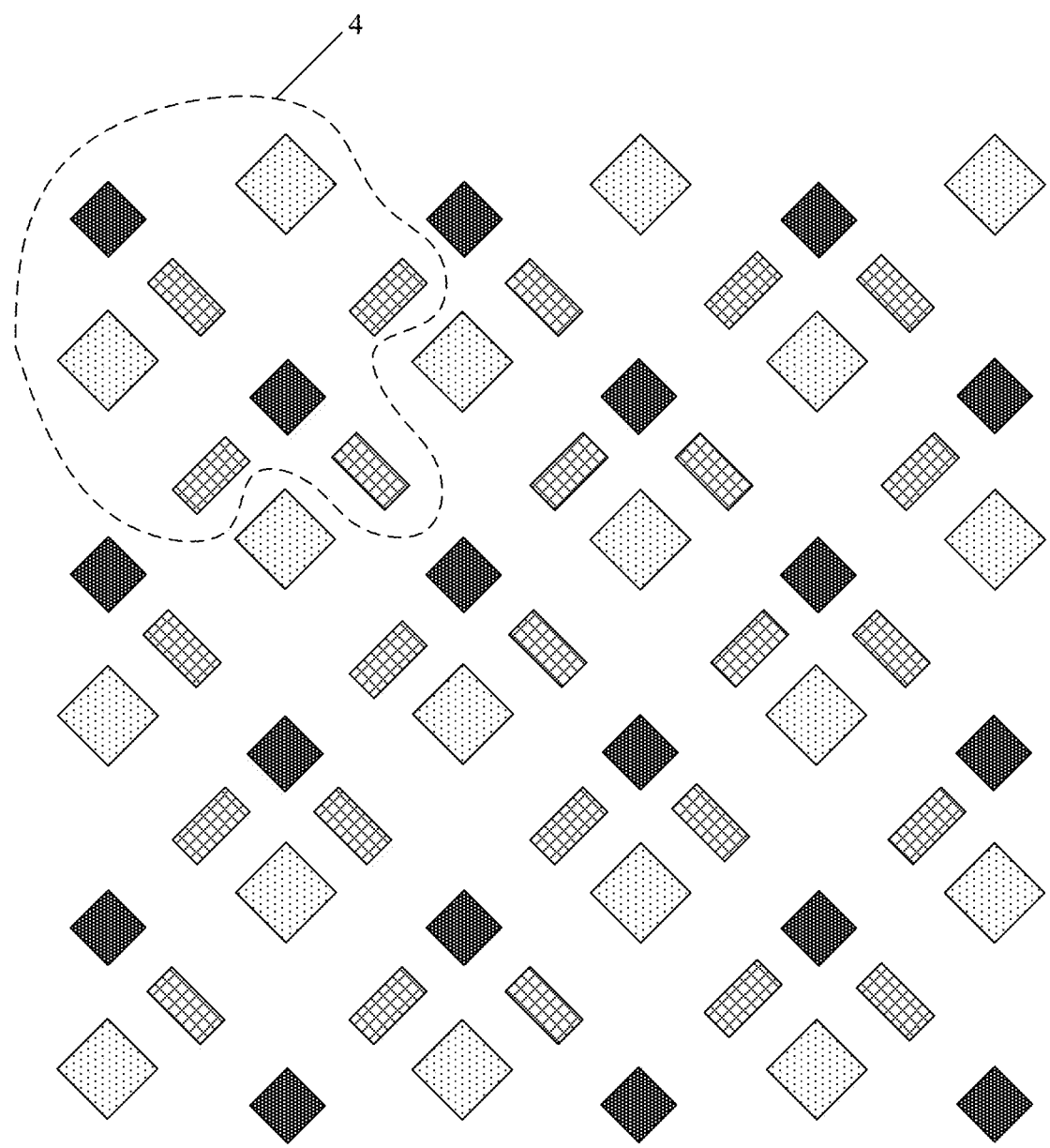
FIG. 2 illustrates a schematic diagram of an exemplary display panel consistent with disclosed embodiments of the present disclosure.

FIG. 2 illustrates a schematic diagram of a display panel consistent with disclosed embodiments of the present disclosure. Referring to FIG. 2, the display panel may include a plurality of pixel units 4 arranged in an array.

Figure 3:
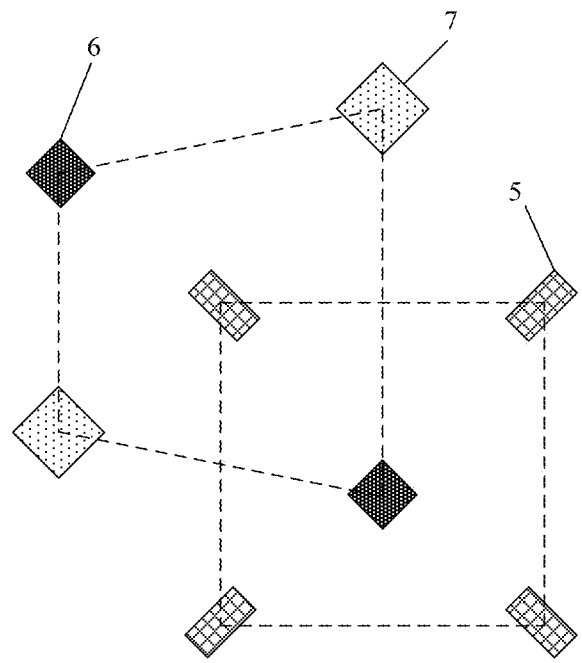
FIG. 3 illustrates a schematic diagram of an exemplary pixel unit consistent with disclosed embodiments of the present disclosure.

FIG. 3 illustrates a schematic diagram of a pixel unit consistent with disclosed embodiments of the present disclosure. Referring to FIG. 2 and FIG. 3, each pixel unit 4 may include four first sub-pixels 5, two second sub-pixels 6, and two third sub-pixels 7.

Centers of the two second sub-pixels 6 and centers of the two third sub-pixels 7 may form a virtual isosceles trapezoid. The two second sub-pixels 6 may be located on both ends of a diagonal of the virtual isosceles trapezoid, and the two third sub-pixels 7 may be located on both ends of another diagonal of the virtual isosceles trapezoid.

Centers of the four first sub-pixels 5 may form a virtual quadrilateral. An interior of the virtual quadrilateral may include one second sub-pixel 6, and an interior of the virtual isosceles trapezoid may include one first sub-pixel 5.

The center of the first sub-pixel 5 may be the geometric center of the shape of the first sub-pixel 5, the center of the second sub-pixel 6 may be the geometric center of the shape of the second sub-pixel 6, and the center of the third sub-pixel 7 may be the geometric center of the shape of the third sub-pixel 7. It should be understood that the sub-pixel in the display panel may be defined by forming an opening in a pixel definition layer, and the center of the first sub-pixel may be the geometric center of the shape defined by the opening in the pixel definition layer of the display panel. In an actual process, due to process fluctuation or process error, the center of the sub-pixel may have a certain offset, as long as the offset is within the range of process error.

For example, the first sub-pixel 5 may have a rectangle shape, and the center of the first sub-pixel 5 may be an intersection of the diagonals of the rectangle.

Referring to FIG. 2 and FIG. 3, the first sub-pixels 5, the second sub-pixels 6 and the third sub-pixels 7 in each pixel unit 4 may be arranged in a specific manner, such that the centers of the four first sub-pixels 5 may form a virtual quadrilateral, the centers of the two second sub-pixels 6 and the centers of the two third sub-pixels 7 may form a virtual isosceles trapezoid. The two second sub-pixels 6 may be located on both ends of a diagonal of the virtual isosceles trapezoid, and the two third sub-pixels 7 may be located on both ends of another diagonal of the virtual isosceles trapezoid. The interior of the virtual quadrilateral may include one second sub-pixel 6, and the interior of the virtual isosceles trapezoid may include one first sub-pixel 5.

After the plurality of pixel units 4 are arranged in an array, a new type of pixel arrangement manner may be formed. Compared with the pixel arrangement manner shown in FIG. 1, such new type of pixel arrangement manner may obviously greatly improve the display effect of the display panel. In one embodiment, the problem of jaggedness when the display panel displays an oblique line and the problem of poor text display effect may be solved to a great extent based on such specific pixel arrangement manner.

In each pixel unit 4 in the disclosed embodiments of the present disclosure, the centers of the two second sub-pixels 6 and the centers of the two third sub-pixels 7 may form a virtual isosceles trapezoid. Compared with a case where the centers of the two second sub-pixels 6 and the centers of the two third sub-pixels 7 form a virtual square with the upper base of the virtual isosceles trapezoid as the side length, the available space may be improved. In other words, the space for forming the first sub-pixel 5 inside the virtual isosceles trapezoid may increase, which may reduce the requirements for forming the first sub-pixel 5, may reduce the process difficulty, thereby improving the preparation yield of the pixel arrangement structures.

Figure 4:
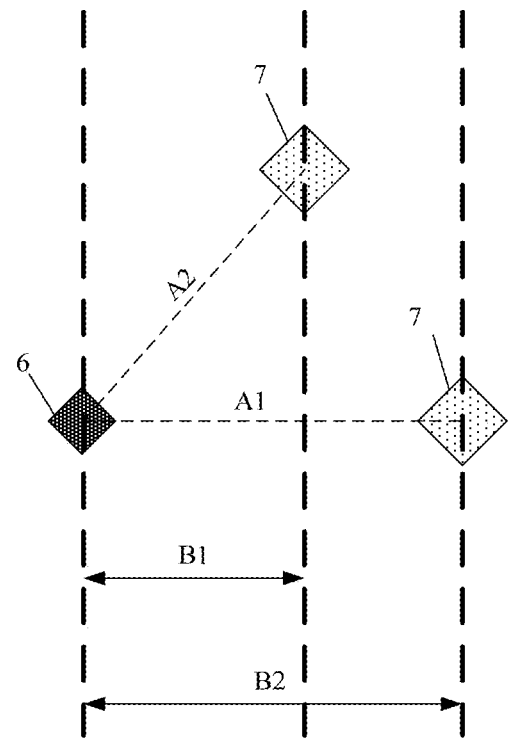
FIG. 4 illustrates a schematic diagram of a variation effect of a positional relationship between a second sub-pixel and a third sub-pixel consistent with disclosed embodiments of the present disclosure.

FIG. 4 illustrates a schematic diagram of a variation effect of a positional relationship between a second sub-pixel and a third sub-pixel consistent with disclosed embodiments of the present disclosure. Referring to FIG. 4, under the condition that the pixel evaporation process conditions remain unchanged, considering the problems such as color mixing between pixels caused by evaporation, a certain process margin may have to be reserved between adjacent pixels. In other words, in a case where a distance between the center of the second sub-pixel 6 and the center of the third sub-pixel 7 does not change (e.g., A1=A2), a line connecting the center of the second sub-pixel 6 and the center of the third sub-pixel 7 may be changed from a state parallel to the row direction of the array to a state intersecting with the row direction of the array (e.g., as the hypotenuse of the virtual isosceles trapezoid). The spacing distance between the columns where the second sub-pixel 6 and the third sub-pixel 7 are located may decrease (e.g., B1<B2), thereby achieving the close arrangement of sub-pixels. In other words, the PPI (pixel density) of the display panel may increase, thereby improving the display performance of the display panel.

Figure 5:
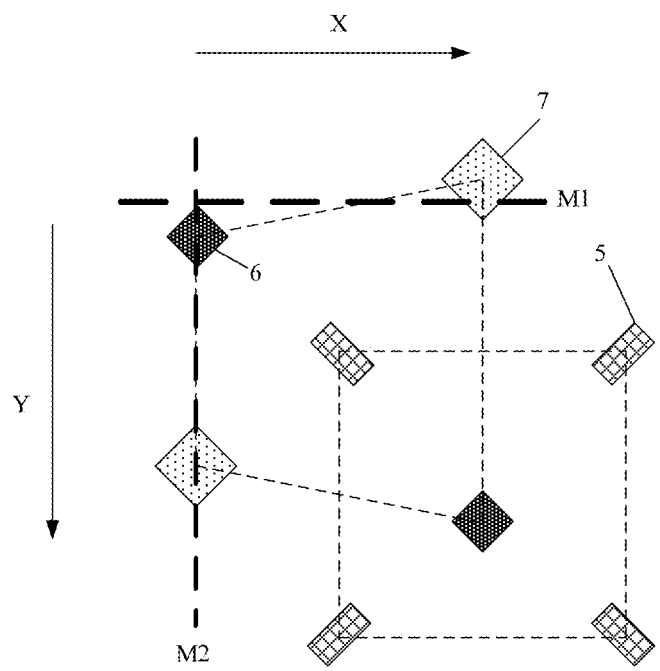
FIG. 5 illustrates a schematic diagram of another exemplary pixel unit consistent with disclosed embodiments of the present disclosure.

FIG. 5 illustrates a schematic diagram of another pixel unit consistent with disclosed embodiments of the present disclosure. In one embodiment, referring to FIG. 5, in a first direction X, the center of the second sub-pixel 6 and the center of the third sub-pixel 7 may be located on two sides of a same virtual straight line M1. In a second direction Y, the center of the second sub-pixel 6 and the center of the third sub-pixel 7 may be located on a same virtual straight line M2. The first direction X may be perpendicular to the second direction Y.

The first direction X may be parallel to the row direction of the pixel units arranged in an array, and the second direction Y may be parallel to the column direction of the pixel units arranged in an array.

In other words, in the virtual isosceles trapezoid formed by the centers of the two second sub-pixels 6 and the centers of the two third sub-pixels 7, the upper base and the lower base may be parallel to the column direction of the pixel units arranged in an array, and the hypotenuse may intersect the row direction of the pixel unit arranged in an array. It should be understood that rows and columns are relative. In an actual display panel, the data line may be arranged along the row direction or along the column direction, and the specific arrangement manner may be determined according to practical applications.

In one embodiment, the first sub-pixel 5 may be a green sub-pixel, the second sub-pixel 6 may be a red sub-pixel, and the third sub-pixel 7 may be a blue sub-pixel. In another embodiment, the first sub-pixel 5 may be a green sub-pixel, the second sub-pixel 6 may be a blue sub-pixel, and the third sub-pixel 7 may be a red sub-pixel.

Figure 6:
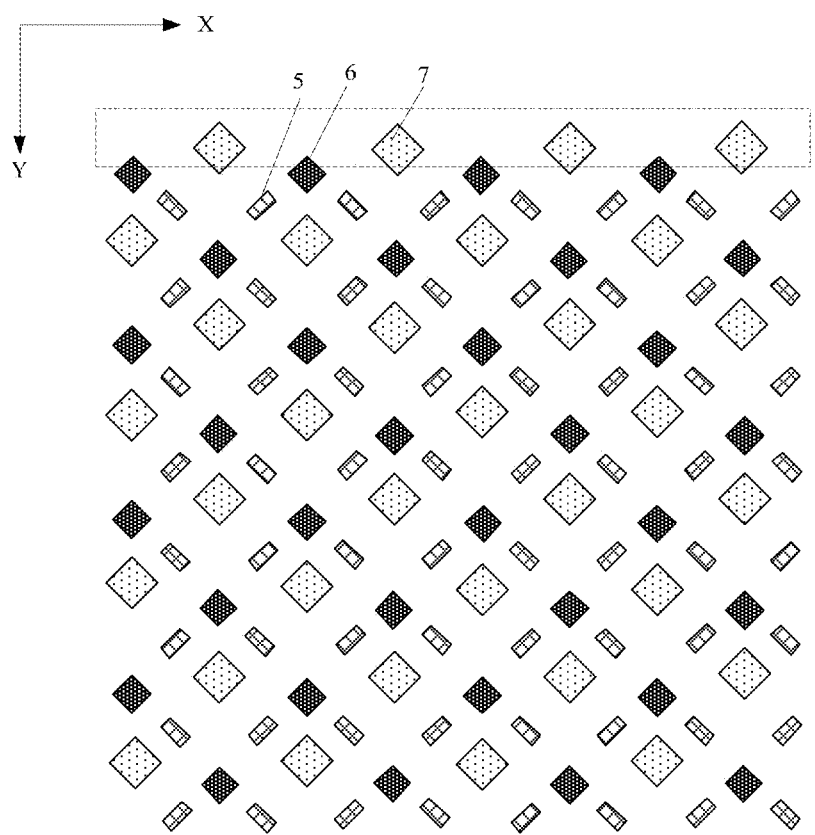
FIG. 6 illustrates a schematic diagram of another exemplary display panel consistent with disclosed embodiments of the present disclosure.

FIG. 6 illustrates a schematic diagram of another display panel consistent with disclosed embodiments of the present disclosure. The first sub-pixel 5 may be a green sub-pixel, the second sub-pixel 6 may be a red sub-pixel, and the third sub-pixel 7 may be a blue sub-pixel. When the line connecting the center of the red sub-pixel and the center of the blue sub-pixel is parallel to the first direction X, and the red sub-pixel and the blue sub-pixel are alternately arranged in a same row, magenta color fringing may be formed at the edge of the display panel. To solve such problem, in one embodiment, referring to FIG. 6, the second sub-pixel 6 and the third sub-pixel 7 may be arranged staggered in the first direction X (e.g., the row direction of the pixel unit arranged in an array). As shown in the dotted box in FIG. 6, merely the second sub-pixel 6 or the third sub-pixel 7 may be exposed, to avoid the occurrence of the magenta color fringing formed when the line connecting the center of the red sub-pixel and the center of the blue sub-pixel is parallel to the row direction of the pixel units arranged in an array. The color fringing effect of the display panel may be reduced using a manner of staggered arrangement, which may improve the display effect of the display panel, and because human eye is not sensitive to the brightness of the blue sub-pixel, may further weaken the color fringing effect of the upper edge.

Further, because human eye is not sensitive to the blue color, in the disclosed embodiments, the third sub-pixel 7 as the blue sub-pixel may be exposed, to further reduce the color fringing effect of the display panel.

Figure 7:
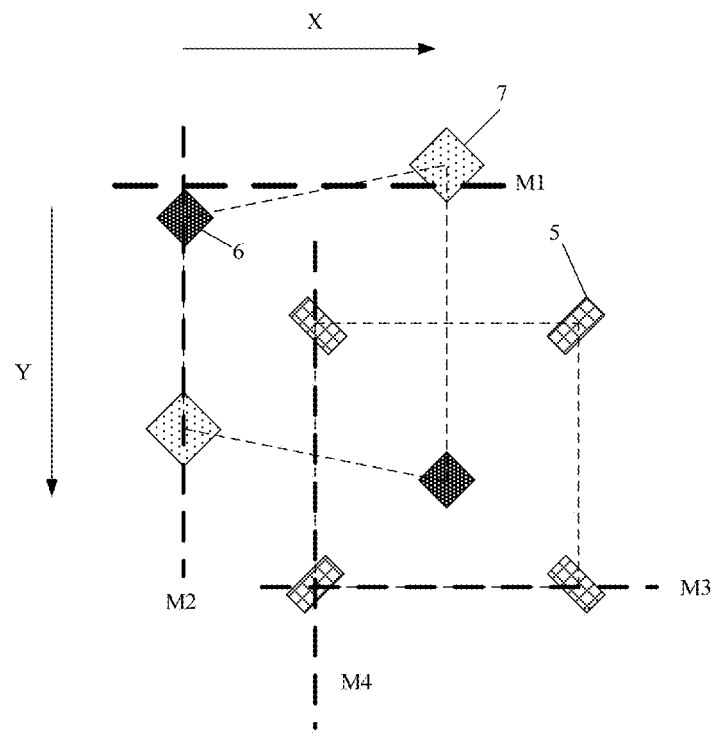
FIG. 7 illustrates a schematic diagram of another exemplary pixel unit consistent with disclosed embodiments of the present disclosure.

FIG. 7 illustrates a schematic diagram of another pixel unit consistent with disclosed embodiments of the present disclosure. In one embodiment, referring to FIG. 7, in the first direction X, the centers of the plurality of first sub-pixels 5 may be located on a same virtual straight line M3, and in the second direction Y, the centers of the plurality of first sub-pixels 5 may be located on a same virtual straight line M4. In each pixel unit 4, the four first sub-pixels 5 may form a virtual square or a virtual rectangle.

The first sub-pixel 5 as a green sub-pixel may be used as an example. Because human eye is highly sensitive to green color, the first sub-pixels 5 may be arranged in an array in the first direction X and the second direction Y, such that the first sub-pixels 5 may be uniformly distributed on the entire display panel, which may improve the visual effect of the display panel.

Figure 8:
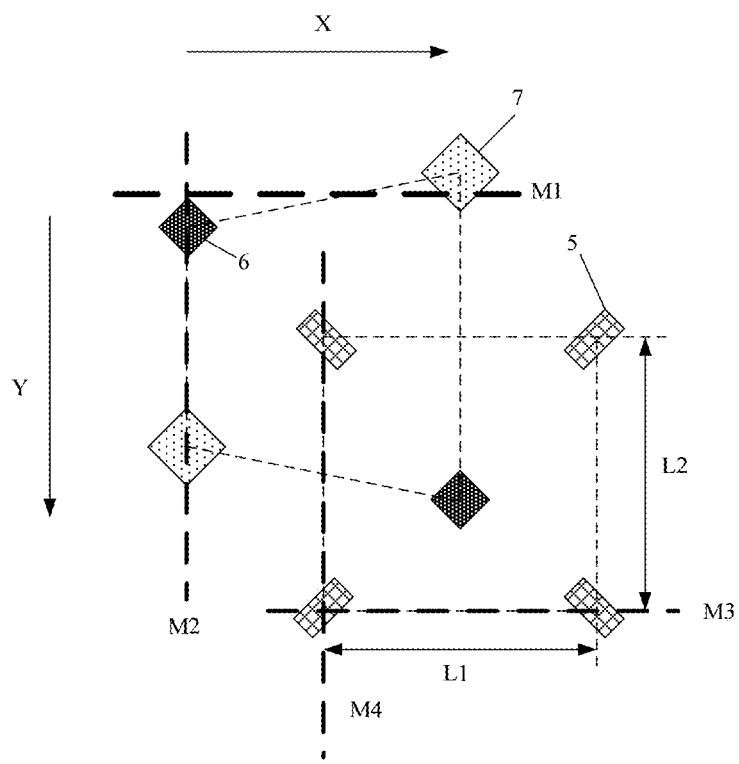
FIG. 8 illustrates a schematic diagram of another exemplary pixel unit consistent with disclosed embodiments of the present disclosure.

FIG. 8 illustrates a schematic diagram of another pixel unit consistent with disclosed embodiments of the present disclosure. In one embodiment, referring to FIG. 8, the distance between the centers of two adjacent first sub-pixels 5 in the first direction X is L1, and the distance between the centers of two adjacent first sub-pixels 5 in the second direction Y is L2, where L1=L2.

In the disclosed embodiments, referring to FIG. 8, in each pixel unit 4, four first sub-pixels 5 may form a virtual square.

The first sub-pixel 5 as a green sub-pixel may be used as an example. Because the human eye is highly sensitive to green color, the first sub-pixels 5 may be arranged in a uniform array along the first direction X and the second direction Y, such that the distance between the centers of two adjacent first sub-pixels 5 may be equal. In the entire display panel, the green sub-pixels may be evenly distributed in the first direction X and the second direction Y, which may further improve the display effect of the display panel.

Figure 9:
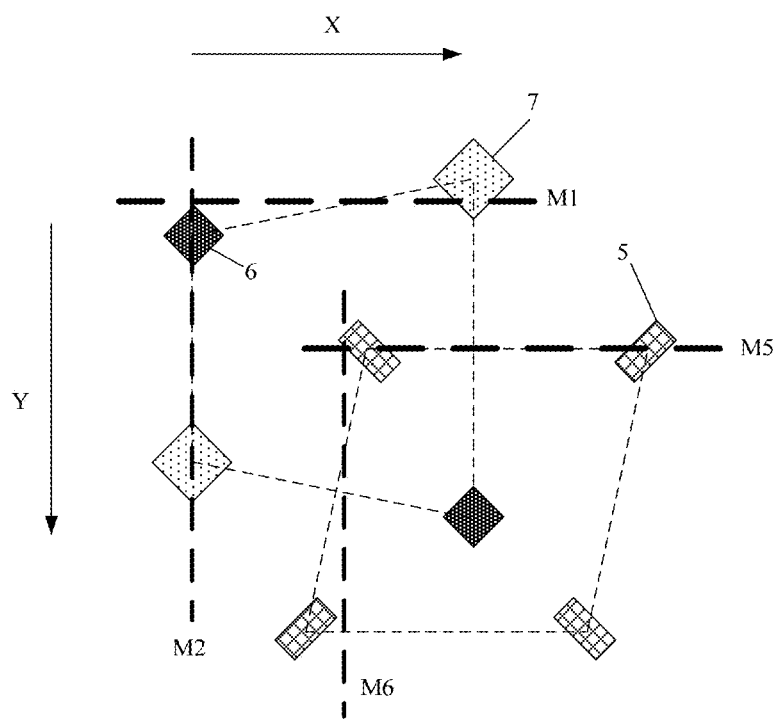
FIG. 9 illustrates a schematic diagram of another exemplary pixel unit consistent with disclosed embodiments of the present disclosure.

FIG. 9 illustrates a schematic diagram of another pixel unit consistent with disclosed embodiments of the present disclosure. In one embodiment, referring to FIG. 9, in the first direction X, the centers of the plurality of first sub-pixels 5 may be located on a same virtual straight line M5, and in the second direction Y, the centers of the plurality of first sub-pixels 5 may be located on both sides of a same virtual straight line M6.

In the disclosed embodiments, referring to FIG. 9, in each pixel unit 4, centers of four first sub-pixels 5 may form a virtual parallelogram. The virtual parallelogram in the disclosed embodiments may refer to a virtual parallelogram not including the virtual rectangle or the virtual square. In other words, an angle between two adjacent sides of the virtual parallelogram may be an acute angle or an obtuse angle, or the angle between the two adjacent sides of the virtual parallelogram may be a non-right angle.

The virtual parallelogram in FIG. 9 may provide a substantially long diagonal space, which may increase the distance between sub-pixels, may facilitate to increase the disposure space of the second sub-pixel 6 located inside the virtual parallelogram, and may reduce the requirements for forming the second sub-pixel 6, thereby improving the production yield of the pixel arrangement structures.

In one embodiment, when the shape of the second sub-pixel 6 is a rectangle, a length extension direction of the second sub-pixel 6 may be set along the longer diagonal of the virtual parallelogram.

Figure 10:
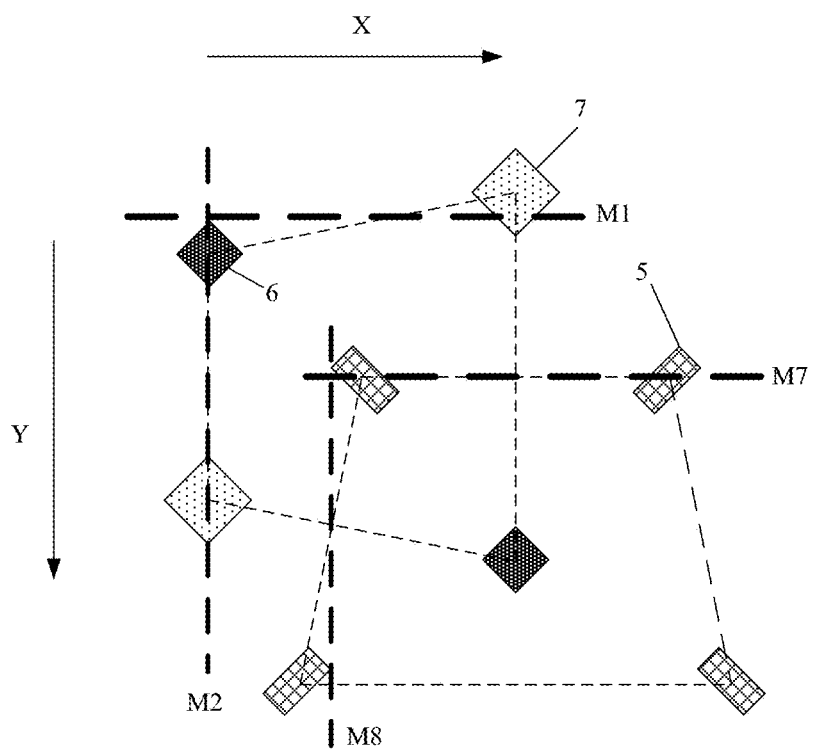
FIG. 10 illustrates a schematic diagram of another exemplary pixel unit consistent with disclosed embodiments of the present disclosure.

FIG. 10 illustrates a schematic diagram of another pixel unit consistent with disclosed embodiments of the present disclosure. In one embodiment, referring to FIG. 10, in the first direction X, the centers of the plurality of first sub-pixels 5 may be located on a same virtual straight line M7, and in the second direction Y, the centers of the plurality of first sub-pixels 5 may be located on both sides of a same virtual straight line M8.

In the disclosed embodiments, referring to FIG. 10, in each pixel unit 4, centers of the four first sub-pixels 5 may form a virtual isosceles trapezoid. The upper base and lower base of the virtual isosceles trapezoid may be parallel to the row direction of the pixel unit arranged in an array. The hypotenuses of the virtual isosceles trapezoid may intersect the column direction of the pixel unit arranged in an array.

In each pixel unit 4, the centers of the four first sub-pixels 5 may form a virtual isosceles trapezoid. Compared with a case where the centers of the four first sub-pixels 5 form a virtual square with the upper base of the virtual isosceles trapezoid as the side length, the available space may be improved. In other words, the space for forming the second sub-pixel 6 inside the virtual isosceles trapezoid may increase, which may reduce the requirements for forming the second sub-pixel 6, thereby improving the preparation yield of the pixel arrangement structures.

Figure 11:
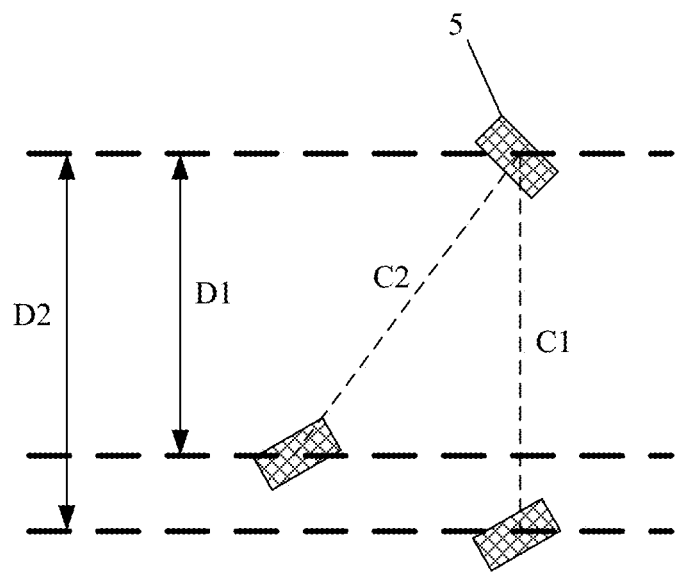
FIG. 11 illustrates a schematic diagram of a variation effect of a positional relationship between first sub-pixels consistent with disclosed embodiments of the present disclosure.

FIG. 11 illustrates a schematic diagram of a variation effect of a positional relationship between the first sub-pixels consistent with disclosed embodiments of the present disclosure. Referring to FIG. 11, in a case where a distance between the centers of adjacent two first sub-pixels 5 does not change (e.g., C1=C2), a line connecting the centers of adjacent two first sub-pixels 5 may be changed from a state parallel to the row direction of the array to a state intersecting with the row direction of the array (e.g., as the hypotenuse of the virtual isosceles trapezoid). The spacing distance between the rows where the two first sub-pixel 5 are located may decrease (e.g., D1<D2). At the same time, the centers of the second sub-pixel 6 and the centers of the third sub-pixel 7 may also be arranged in a virtual isosceles trapezoid, to achieve the close arrangement of sub-pixels while avoiding the problem of color mixing between pixels caused by evaporation. In other words, the PPI (pixel density) of the display panel may increase, thereby improving the display performance of the display panel.

Figure 12:
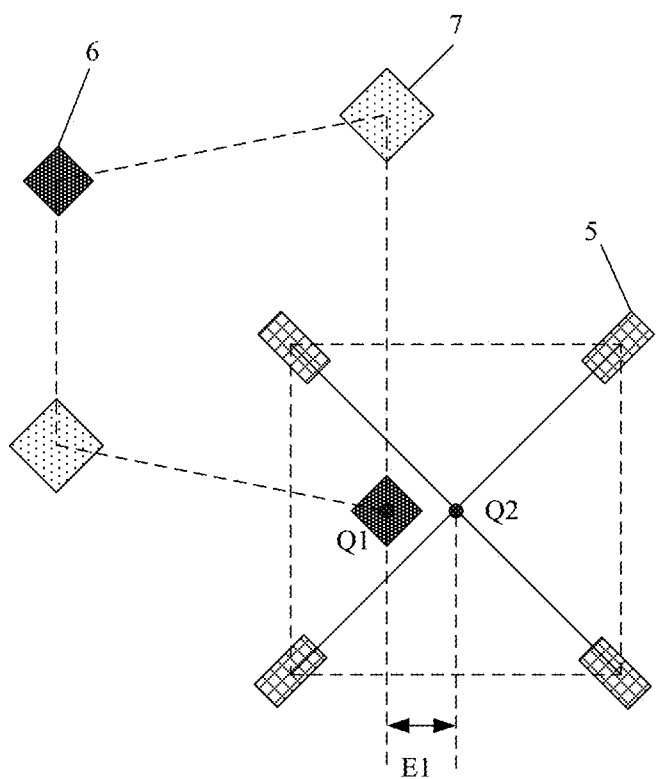
FIG. 12 illustrates a schematic diagram of another exemplary pixel unit consistent with disclosed embodiments of the present disclosure.

FIG. 12 illustrates a schematic diagram of another pixel unit consistent with disclosed embodiments of the present disclosure. In one embodiment, referring to FIG. 12, a shortest distance between the center Q1 of the second sub-pixel 6 and the intersection Q2 of the diagonals of the virtual quadrilateral may be a first preset distance E1, where the first preset distance E1 may be greater than zero.

In one embodiment, the center Q1 of the second sub-pixel 6 located in the virtual quadrilateral may not coincide with the intersection Q2 of the diagonals of the virtual quadrilateral. The virtual quadrangle may be a virtual square as an example. In other words, the center Q1 of the second sub-pixel 6 may not coincide with the intersection of diagonals of the virtual square.

In a case where the center Q1 of the second sub-pixel 6 is not limited to coincide with the intersection Q2 of the diagonals of the virtual quadrilateral, the selection of the disposure position of the second sub-pixel 6 may be substantially flexible. By adjusting the position of the second sub-pixel 6, the space utilization rate of the second sub-pixel 6 in the virtual quadrilateral may be optimized to maximize the space utilization rate. In the case where the space utilization rate of the second sub-pixel 6 is maximized, the light-emitting area of the second sub-pixel 6 may increase, the driving current of the second sub-pixel 6 may be reduced, and the service life of the second sub-pixel 6 may further increase, thereby improving the display performance of the display panel.

Figure 13:
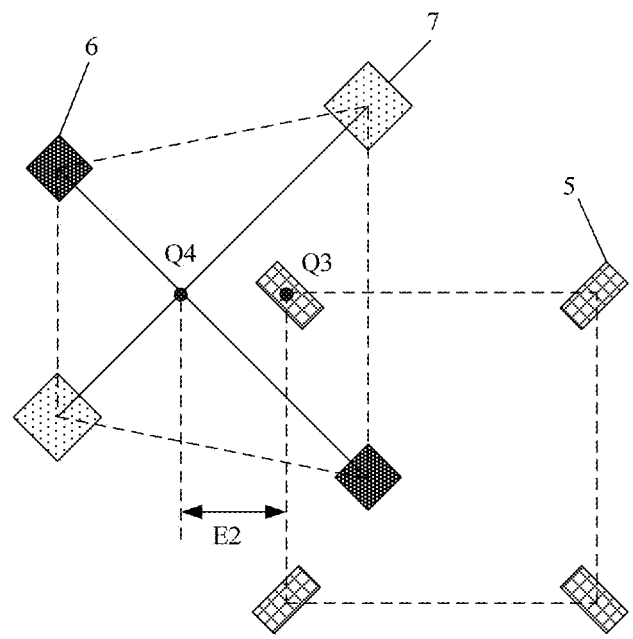
FIG. 13 illustrates a schematic diagram of another exemplary pixel unit consistent with disclosed embodiments of the present disclosure.

FIG. 13 illustrates a schematic diagram of another pixel unit consistent with disclosed embodiments of the present disclosure. In one embodiment, referring to FIG. 13, a shortest distance between a center Q3 of the first sub-pixel 5 and an intersection Q4 of diagonals of the virtual isosceles trapezoid may be a second preset distance E2, where the second preset distance E2 may be greater than zero.

In one embodiment, the center Q3 of the first sub-pixel 5 located in the virtual isosceles trapezoid may not coincide with the intersection Q4 of the diagonals of the virtual isosceles trapezoid.

In a case where the center Q3 of the first sub-pixel 5 is not limited to coincide with the intersection Q4 of the diagonals of the virtual isosceles trapezoid, the selection of the disposure position of the first sub-pixel 5 may be substantially flexible. By adjusting the position of the first sub-pixel 5, the space utilization rate of the first sub-pixel 5 in the virtual isosceles trapezoid may be optimized to maximize the space utilization rate. In the case where the space utilization rate of the first sub-pixel 5 is maximized, the light-emitting area of the first sub-pixel 5 may increase, the driving current of the first sub-pixel 5 may be reduced, and the service life of the first sub-pixel 5 may further increase, thereby improving the display performance of the display panel.

Figure 14:
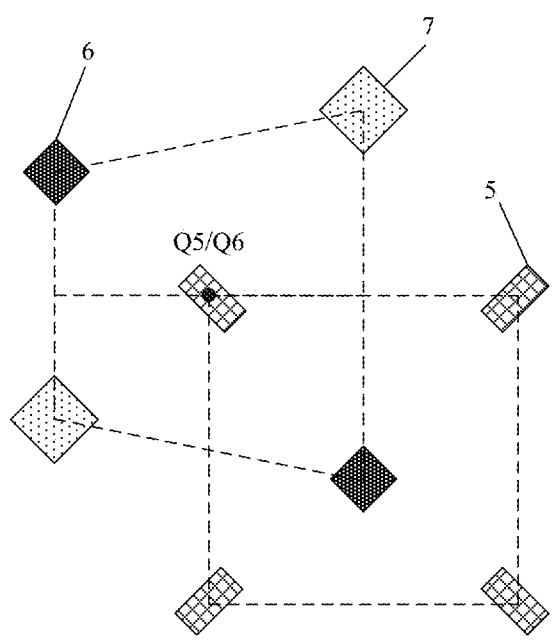
FIG. 14 illustrates a schematic diagram of another exemplary pixel unit consistent with disclosed embodiments of the present disclosure.

FIG. 14 illustrates a schematic diagram of another pixel unit consistent with disclosed embodiments of the present disclosure. In one embodiment, referring to FIG. 14, a shortest distance between a center Q5 of the first sub-pixel 5 and a midpoint Q6 of the mid-perpendicular line of the virtual isosceles trapezoid may be a third preset distance E3, where the third preset distance E3 may be equal to zero.

In one embodiment, the center Q5 of the first sub-pixel 5 may coincide with the midpoint Q6 of the mid-perpendicular line of the virtual isosceles trapezoid.

The first sub-pixel 5 as a green sub-pixel may be used as an example. Because human eye is highly sensitive to green color, through disposing the center Q5 of the first sub-pixel 5 at the midpoint Q6 of the mid-perpendicular line of the virtual isosceles trapezoid, the first sub-pixels 5 may be uniformly distributed to the greatest extent. Therefore, the distance from the first sub-pixel 5 to any other adjacent sub-pixel may be approximately the same, thereby improving the display effect of the display panel to the greatest extent.

Figure 15:
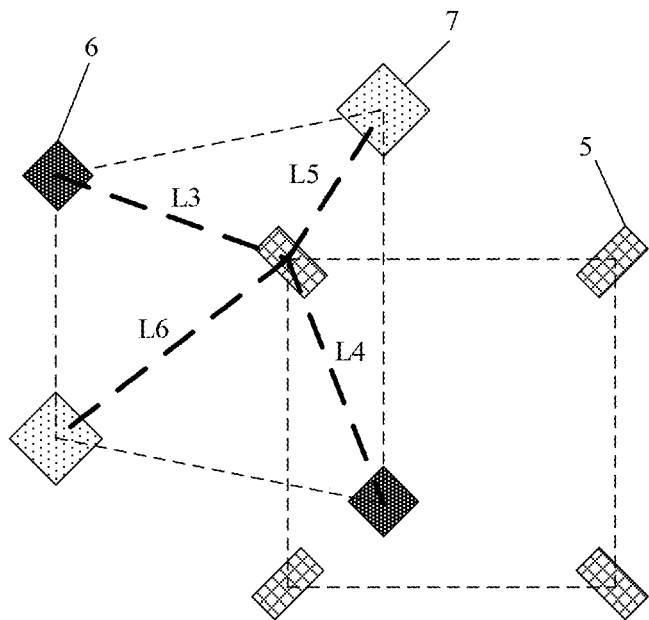
FIG. 15 illustrates a schematic diagram of another exemplary pixel unit consistent with disclosed embodiments of the present disclosure.

FIG. 15 illustrates a schematic diagram of another pixel unit consistent with disclosed embodiments of the present disclosure. In one embodiment, referring to FIG. 15, in a same virtual isosceles trapezoid, a distance between the center of the first sub-pixel 5 and the center of one of the second sub-pixels 6 may be L3, a distance between the center of the first sub-pixel 5 and the center of another one of the second sub-pixels 6 may be L4, a distance between the center of the first sub-pixel 5 and the center of one of the third sub-pixels 7 may be L5, and a distance between the center of the first sub-pixel 5 and the center of another one of the third sub-pixels 7 may be L6, where L3=L4≠L5≠L6.

In one embodiment, in the same virtual isosceles trapezoid, the center of the first sub-pixel 5 located inside the virtual isosceles trapezoid may be located on the mid-perpendicular line connecting the centers of the two second sub-pixels 6, and may not be located on the mid-perpendicular line connecting the centers of the two third sub-pixels 7.

Figure 16:
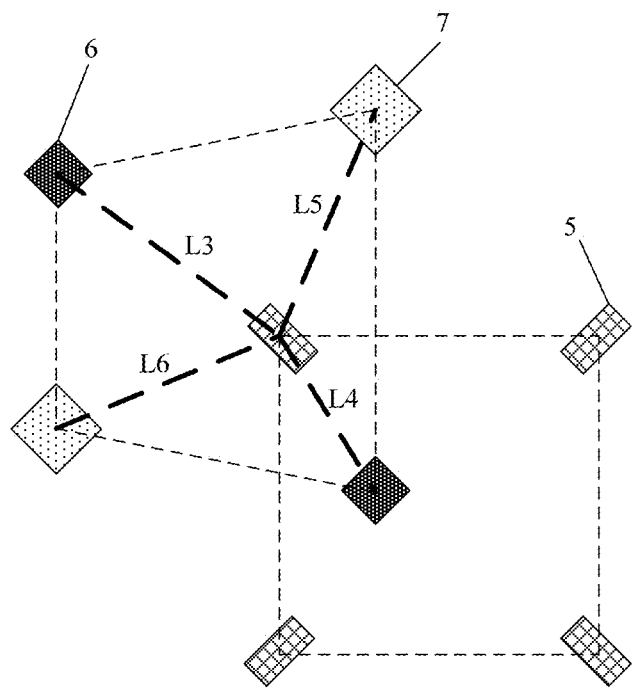
FIG. 16 illustrates a schematic diagram of another exemplary pixel unit consistent with disclosed embodiments of the present disclosure.

FIG. 16 illustrates a schematic diagram of another pixel unit consistent with disclosed embodiments of the present disclosure. In one embodiment, referring to FIG. 16, in a same virtual isosceles trapezoid, a distance between the center of the first sub-pixel 5 and the center of one of the second sub-pixels 6 may be L3, a distance between the center of the first sub-pixel 5 and the center of another one of the second sub-pixels 6 may be L4, a distance between the center of the first sub-pixel 5 and the center of one of the third sub-pixels 7 may be L5, and a distance between the center of the first sub-pixel 5 and the center of another one of the third sub-pixels 7 may be L6, where L5=L6≠L3≠L4.

In one embodiment, in the same virtual isosceles trapezoid, the center of the first sub-pixel 5 located inside the virtual isosceles trapezoid may be located on the mid-perpendicular line connecting the centers of the two third sub-pixels 7, and may not be located on the mid-perpendicular line connecting the centers of the two second sub-pixels 6.

Figure 17:
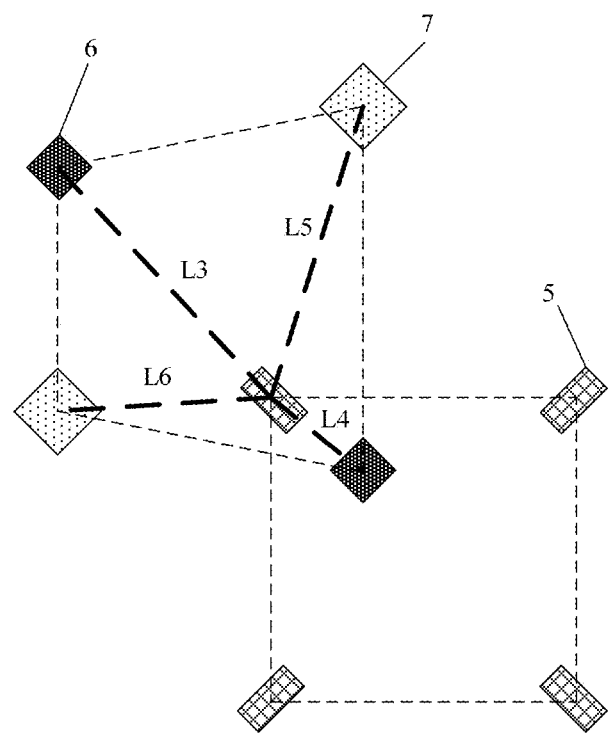
FIG. 17 illustrates a schematic diagram of another exemplary pixel unit consistent with disclosed embodiments of the present disclosure.

FIG. 17 illustrates a schematic diagram of another pixel unit consistent with disclosed embodiments of the present disclosure. In one embodiment, referring to FIG. 17, in a same virtual isosceles trapezoid, a distance between the center of the first sub-pixel 5 and the center of one of the second sub-pixels 6 may be L3, a distance between the center of the first sub-pixel 5 and the center of another one of the second sub-pixels 6 may be L4, a distance between the center of the first sub-pixel 5 and the center of one of the third sub-pixels 7 may be L5, and a distance between the center of the first sub-pixel 5 and the center of another one of the third sub-pixels 7 may be L6, where L3≠L4≠L5≠L6.

In one embodiment, in the same virtual isosceles trapezoid, the center of the first sub-pixel 5 located inside the virtual isosceles trapezoid may not be located on the mid-perpendicular line connecting the centers of the two third sub-pixels 7, and may not be located on the mid-perpendicular line connecting the centers of the two second sub-pixels 6.

FIGS. 15-17 illustrate the position change of the first sub-pixel 5 located inside the virtual isosceles trapezoid in the virtual isosceles trapezoid. Through reasonably setting the distance between the first sub-pixel 5 inside the virtual isosceles trapezoid and any other adjacent sub-pixel, the display performance of the first sub-pixel 5 may be fully optimized.

Further, by adjusting the position of the first sub-pixel 5, the space utilization rate of the first sub-pixel 5 in the virtual isosceles trapezoid may be optimized to maximize the space utilization rate. In the case where the space utilization rate of the first sub-pixel 5 is maximized, the light-emitting area of the first sub-pixel 5 may increase, the driving current of first sub-pixel 5 may be reduced, and the service life of the first sub-pixel 5 may further increase, thereby improving the display performance of the display panel.

Figure 18:
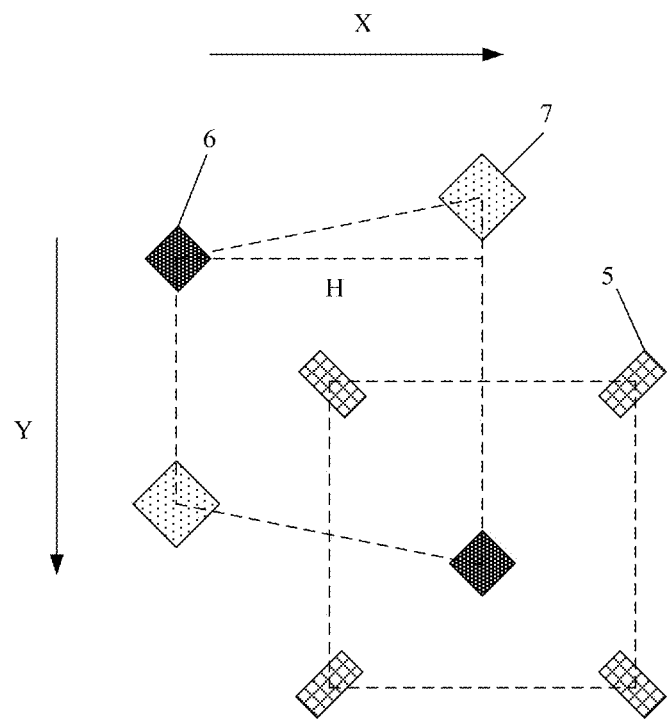
FIG. 18 illustrates a schematic diagram of another exemplary pixel unit consistent with disclosed embodiments of the present disclosure.

FIG. 18 illustrates a schematic diagram of another pixel unit consistent with disclosed embodiments of the present disclosure. In one embodiment, referring to FIG. 18, in a same virtual isosceles trapezoid, a value of a length of the lower base minus a length of the upper base of the virtual isosceles trapezoid may be in a range of approximately $$\frac{H}{32} - \frac{3H}{16}$$

including the endpoint values, where H may be a height of the virtual isosceles trapezoid.

When the line connecting the center of the second sub-pixel 6 and the center of the third sub-pixel 7 is parallel to the row direction of the pixel unit arranged in an array (e.g., the first direction X), a magenta color fringing may be formed, which may affect the display effect of the display panel.

Therefore, in the disclosed embodiments, the second sub-pixel 6 and the third sub-pixel 7 may be arranged staggered in the second direction Y (e.g., the column direction of the pixel unit arranged in an array), and merely the second sub-pixel 6 or the third sub-pixel 7 may be exposed, to reduce the color fringing effect of the display panel.

Further, because human eye is not sensitive to the blue color, in the disclosed embodiments, the third sub-pixel 7 as the blue sub-pixel may be exposed, to further reduce the color fringing effect of the display panel.

Further, by reasonably setting the value of the length of the lower base minus the length of the upper base of the virtual isosceles trapezoid, the specific range of exposing the third sub-pixel 7 as the blue sub-pixel may be determined, to minimize the color fringing effect of the display panel.

Figure 19:
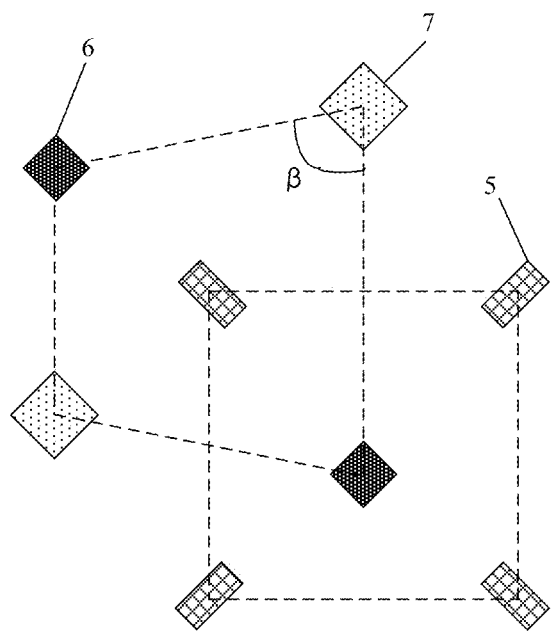
FIG. 19 illustrates a schematic diagram of another exemplary pixel unit consistent with disclosed embodiments of the present disclosure.

FIG. 19 illustrates a schematic diagram of another pixel unit consistent with disclosed embodiments of the present disclosure. In one embodiment, referring to FIG. 19, in a same virtual isosceles trapezoid, an angle β between the lower base and the hypotenuse of the virtual isosceles trapezoid may be in a range of approximately 83°-88° including the endpoint values.

In one embodiment, in the same virtual isosceles trapezoid, the angle β between the lower base and the hypotenuse of the virtual isosceles trapezoid may include 84.5°, 86°, or 87.3°, etc., which may not be limited by the present disclosure.

In another embodiment, referring to FIG. 5, the second sub-pixel 6 may include at least four corners, and the third sub-pixel 7 may include at least four corners. In the second direction Y, at least one corner of the second sub-pixel 6 and at least one corner of the third sub-pixel 7 may be located on the same virtual straight line M2.

In one embodiment, by arranging the second sub-pixel 6 and the third sub-pixel 7 corner-to-corner, the distance between the second sub-pixel 6 and the third sub-pixel 7 located on the hypotenuse and the lower base of the virtual isosceles trapezoid may increase. In other words, the facing area between the sub-pixels may be reduced, and the distance between the sub-pixels may increase, which may extend the leakage path and increase the resistance between adjacent sub-pixels, thereby preventing the hidden-lighting problem of the sub-pixel.

Further, in the disclosed embodiments, referring to FIG. 5, when the first sub-pixel 5 (green sub-pixel) has a rectangular or quasi-rectangular shape, the short side of the first sub-pixel 5 may tend to face towards the sub-pixel (e.g., the second sub-pixel 6 as the red sub-pixel in FIG. 5) with a substantially small area or a substantially short side, and the long side of the first sub-pixel 5 may face towards the sub-pixel (e.g., the third sub-pixel 7 as the blue sub-pixel in FIG. 7) with a substantially large area or a substantially long side. While ensuring the process margin and the aperture ratio of the sub-pixel, the risk of color mixing during vapor deposition of luminescent materials may be reduced, thereby improving the production yield of the display panel.

Figure 20:
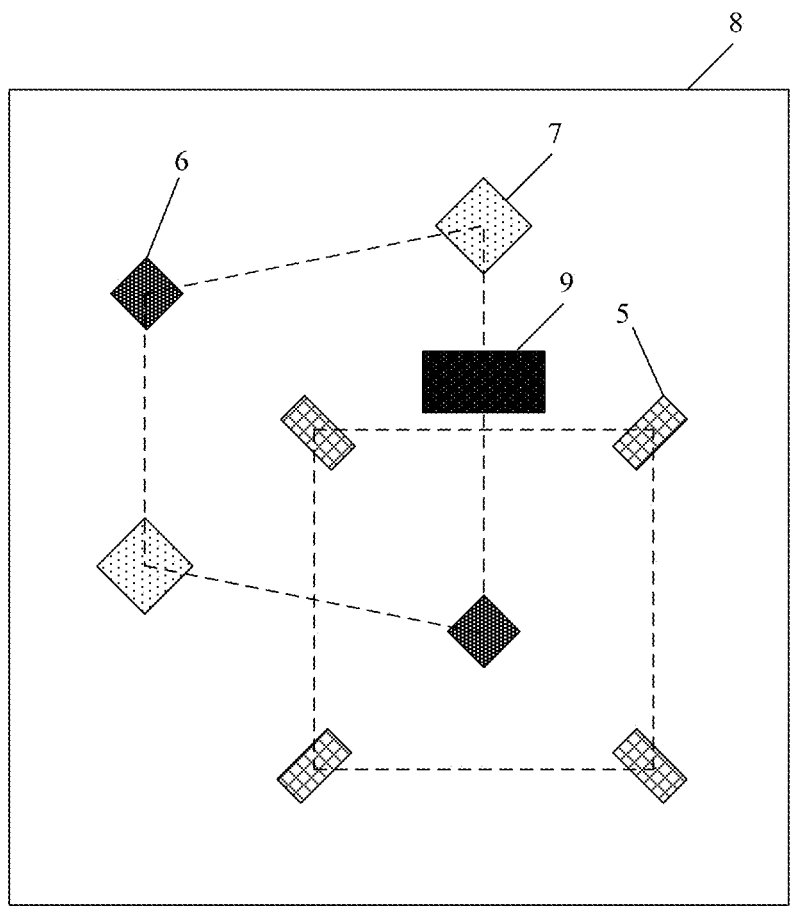
FIG. 20 illustrates a schematic diagram of another exemplary pixel unit consistent with disclosed embodiments of the present disclosure.

FIG. 20 illustrates a schematic diagram of another pixel unit consistent with disclosed embodiments of the present disclosure. In one embodiment, referring to FIG. 20, the display panel may further include a substrate 8 and a supporting pillar 9. An orthographic projection of the supporting pillar 9 on a plane of the substrate 8 may at least partially overlap an orthographic projection of the lower base of the virtual isosceles trapezoid on the plane of the substrate 8.

In one embodiment, through disposing the corresponding supporting pillar 9 at the position of the lower base of the virtual isosceles trapezoid, and extending the path of the leakage current between the two sub-pixels in combination with the actual process design, the hidden lighting problem may be further prevented.

Figure 21:
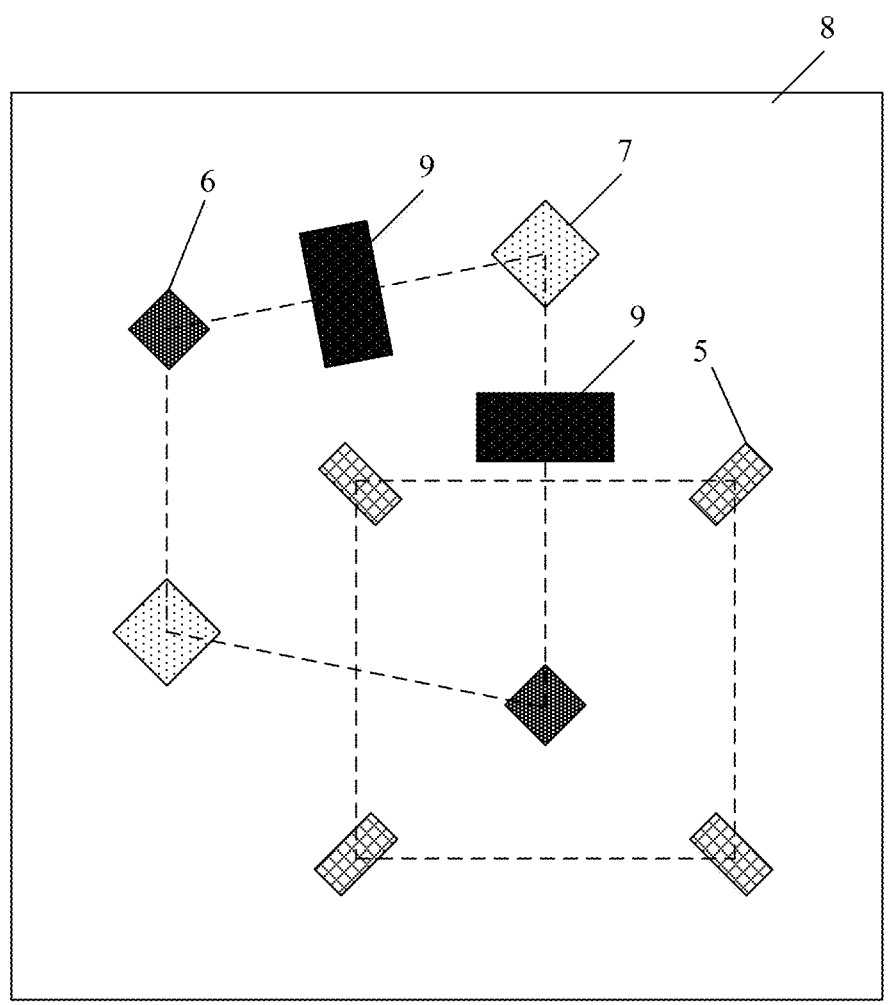
FIG. 21 illustrates a schematic diagram of another exemplary pixel unit consistent with disclosed embodiments of the present disclosure.

FIG. 21 illustrates a schematic diagram of another pixel unit consistent with disclosed embodiments of the present disclosure. In one embodiment, referring to FIG. 21, the supporting pillar 9 may also be disposed on the hypotenuse of the virtual isosceles trapezoid.

In other words, the orthographic projection of the supporting pillar 9 on the plane of the substrate 8 may at least partially overlap an orthographic projection of the hypotenuse of the virtual isosceles trapezoid on the plane of the substrate 8.

Figure 22:
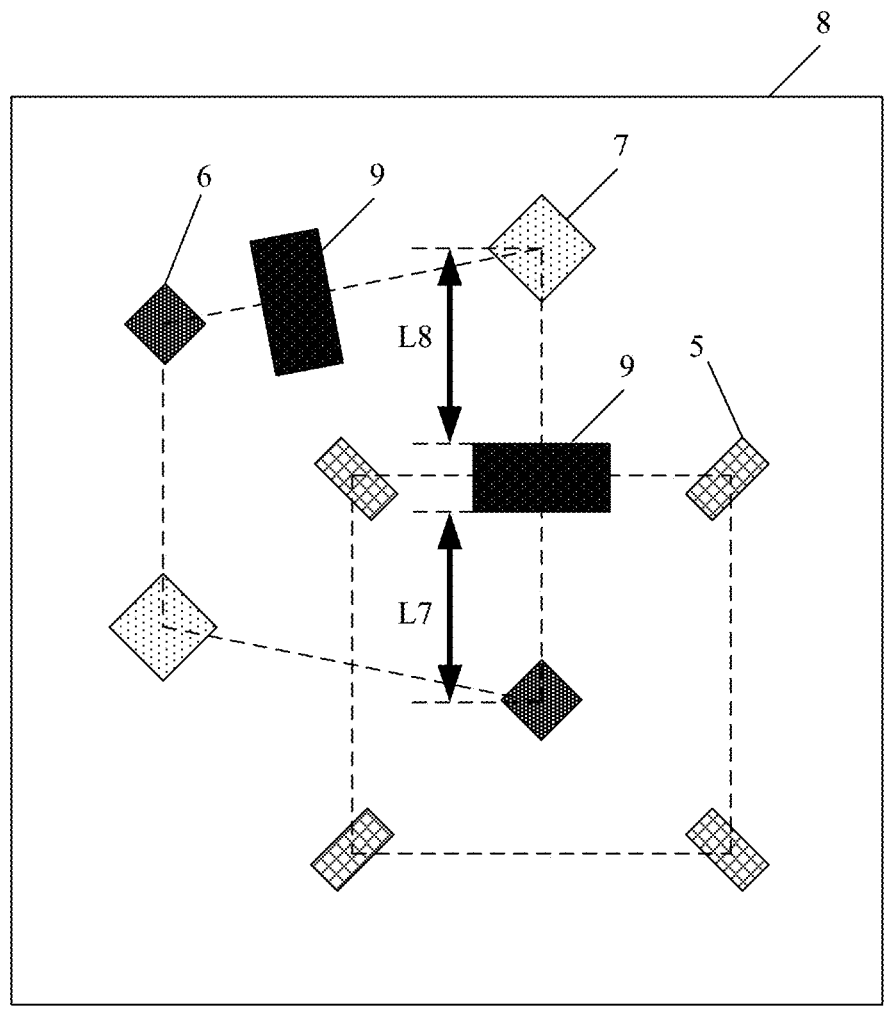
FIG. 22 illustrates a schematic diagram of another exemplary pixel unit consistent with disclosed embodiments of the present disclosure.

FIG. 22 illustrates a schematic diagram of another pixel unit consistent with disclosed embodiments of the present disclosure. In one embodiment, referring to FIG. 22, a shortest distance between the supporting pillar 9 and the second sub-pixel 6 located on one side of the lower base of the virtual isosceles trapezoid may be L7, and a shortest distance between the supporting pillar 9 and the third sub-pixel 7 located on the other side of the lower base of the virtual isosceles trapezoid may be L8, where L7=L8.

In one embodiment, the supporting pillar 9 may be configured to support a fine metal mask in the process of evaporating the luminescent materials. To prevent the impurity particles generated by the scratching of the mask on the supporting pillar 9 from falling into the pixel opening region of the adjacent sub-pixel during the process of evaporating the luminescent materials, the supporting pillar 9 may be disposed at the middle position of the lower base of the virtual isosceles trapezoid. In other words, the shortest distance between the supporting pillar 9 and the second sub-pixel 6 located on one side of the lower base of the virtual isosceles trapezoid may be equal to the shortest distance between the supporting pillar 9 and the third sub-pixel 7 located on the other side of the lower base of the virtual isosceles trapezoid.

Similarly, the supporting pillar 9 located on the hypotenuse of the virtual isosceles trapezoid may be disposed at the middle of the hypotenuse. In other words, a shortest distance between the supporting pillar 9 and the second sub-pixel 6 located on one side of the hypotenuse may be equal to a shortest distance between the supporting pillar 9 and the third sub-pixel 7 located on the other side of the hypotenuse.

Figure 23:
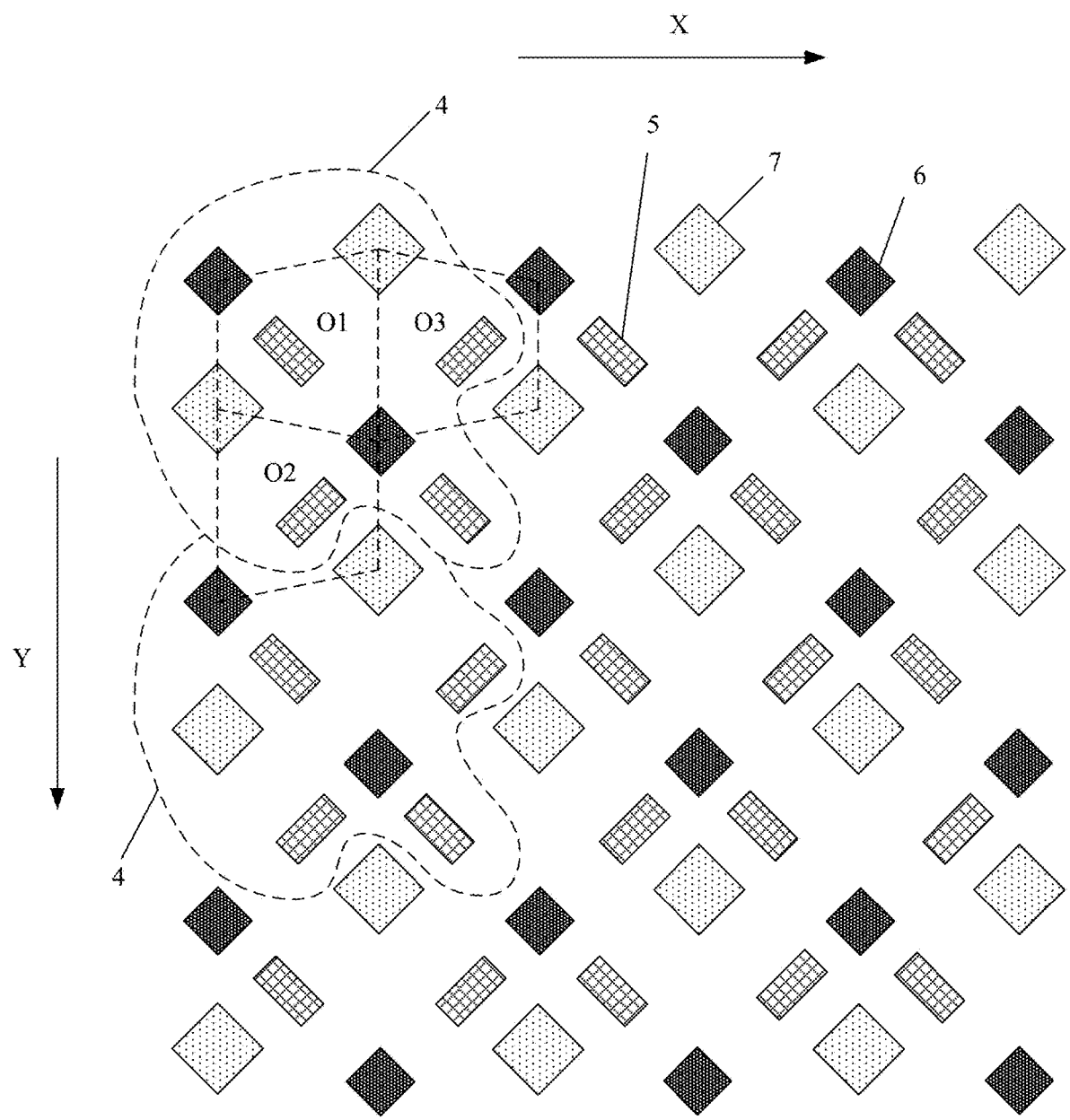
FIG. 23 illustrates a schematic diagram of another exemplary display panel consistent with disclosed embodiments of the present disclosure.

FIG. 23 illustrates a schematic diagram of another display panel consistent with disclosed embodiments of the present disclosure. In one embodiment, referring to FIG. 23, in the first direction X or the second direction Y, adjacent two virtual isosceles trapezoids that share a same side may have a same area. In other words, the areas of the virtual isosceles trapezoid O1, the virtual isosceles trapezoid O2 and the virtual isosceles trapezoid O3 may be the same.

In one embodiment, in the process of arranging the plurality of pixel units 4 in an array, the plurality of pixel units 4 may be arranged substantially regularly, to achieve the close arrangement of the sub-pixels, thereby improving the display effect of the display panel.

Referring to FIG. 23, after the plurality of pixel units 4 are arranged in an array, in the first direction X and the second direction Y, in the virtual quadrilateral formed by the adjacent four second sub-pixels 6, the third sub-pixel 7 may not be located at the intersection of the diagonals of the virtual quadrilateral.

Similarly, in the first direction X and the second direction Y, in the virtual quadrilateral formed by the adjacent four third sub-pixels 7, the second sub-pixel 6 may not be located at the intersection of the diagonals of the virtual quadrilateral.

Figure 24:
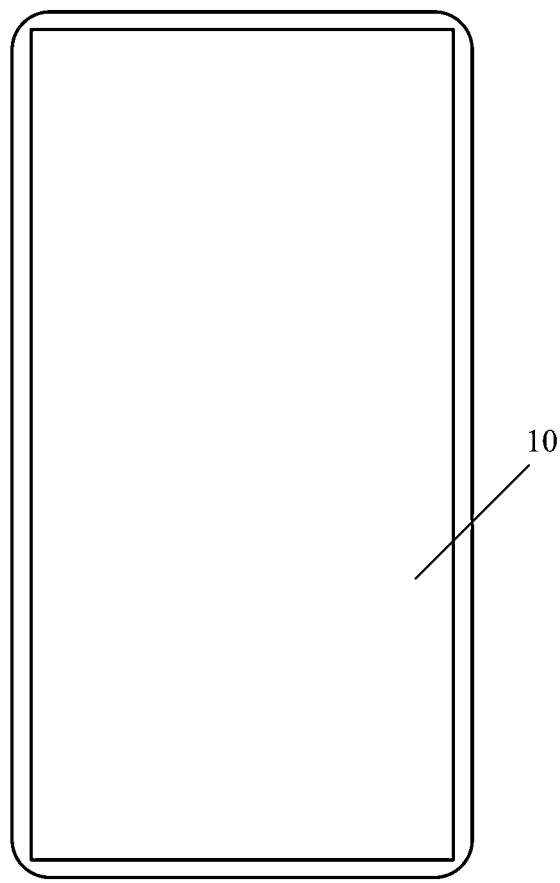
FIG. 24 illustrates a schematic diagram of an exemplary display device consistent with disclosed embodiments of the present disclosure.

The present disclosure also provides a display device. FIG. 24 illustrates a schematic diagram of a display device consistent with disclosed embodiments of the present disclosure. Referring to FIG. 24, the display device 10 may include the display panel in the above-described embodiments. In the disclosed embodiments, the display device 10 may include, but may not be limited to a mobile phone and a tablet. The display device may have the same characteristics as the display panel.

Figure 25:
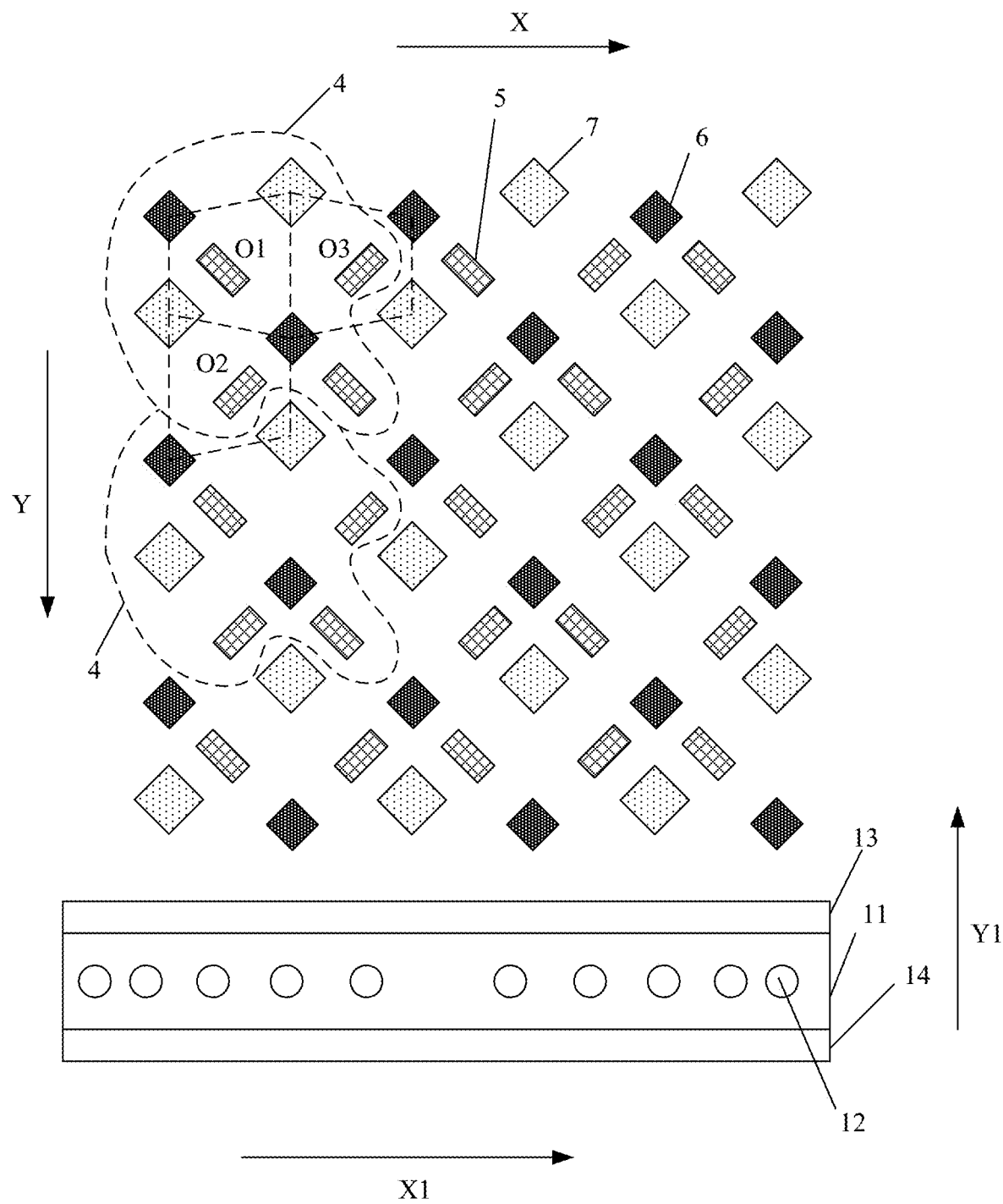
FIG. 25 illustrates a schematic diagram of an exemplary evaporation device consistent with disclosed embodiments of the present disclosure.

The present disclosure also provides an evaporation device. FIG. 25 illustrates a schematic diagram of an evaporation device consistent with disclosed embodiments of the present disclosure. Referring to FIG. 25, the vapor deposition device may be configured to perform a vapor deposition on the above-disclosed display panel.

The evaporation device may include an evaporation source 11. The evaporation source 11 may include a plurality of evaporation holes 12 arranged in sequence along a third direction X1. The evaporation source 11 may also include a first angle plate 13 and a second angle plate 14 arranged on both sides of the evaporation source 11 along a fourth direction Y1.

The third direction X1 may be perpendicular to the fourth direction Y1, and the fourth direction Y1 may be parallel to the upper base or the lower base of the virtual isosceles trapezoid. The third direction X1 may be perpendicular to the second direction Y. The evaporation source 11 may move along the fourth direction Y1, to perform the vapor deposition on the display panel.

In one embodiment, in an evaporation direction (in other words, in the fourth direction Y1), by disposing the first angle plate 13 and the second angle plate 14 on both sides of the evaporation source 11, the evaporation angle may be controlled.

Figure 26:
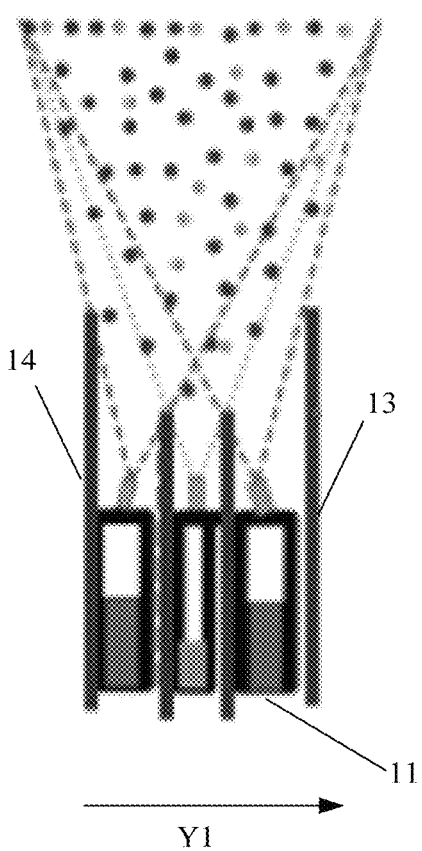
FIG. 26 illustrates a schematic diagram of an evaporation effect of another exemplary evaporation device consistent with disclosed embodiments of the present disclosure.

FIG. 26 illustrates a schematic diagram of an evaporation effect of another evaporation device consistent with disclosed embodiments of the present disclosure. Referring to FIG. 26, by adjusting the height of the first angle plate 13 or the height of the second angle plate 14, the evaporation angle may be adjusted to ensure the maximum mixing area of the evaporation materials.

In addition, in combination with the first angle plate 13 and the second angle plate 14, the shadow during the evaporation of each luminescent material may be improved. In other words, the drift range of the luminescent material outside of the opening area may be reduced, thereby reducing the process margin (which may be understood as the distance between the opening regions of adjacent sub-pixels), such that the sub-pixels in the fourth direction Y1 may be closely arranged, to improve the display effect of the display panel.

Therefore, in a case where a distance between the center of the second sub-pixel 6 and the center of the third sub-pixel 7 does not change, a line connecting the center of the second sub-pixel 6 and the center of the third sub-pixel 7 may be changed from a state parallel to the third direction X1 to a state intersecting with the third direction X1 (e.g., as the hypotenuse of the virtual isosceles trapezoid). The spacing distance between the columns where the second sub-pixel 6 and the third sub-pixel 7 are located may decrease, which may be equivalent to reducing the process margin, thereby achieving the close arrangement of sub-pixels. In other words, the PPI (pixel density) of the display panel may increase, thereby improving the display performance of the display panel.

Figure 27:
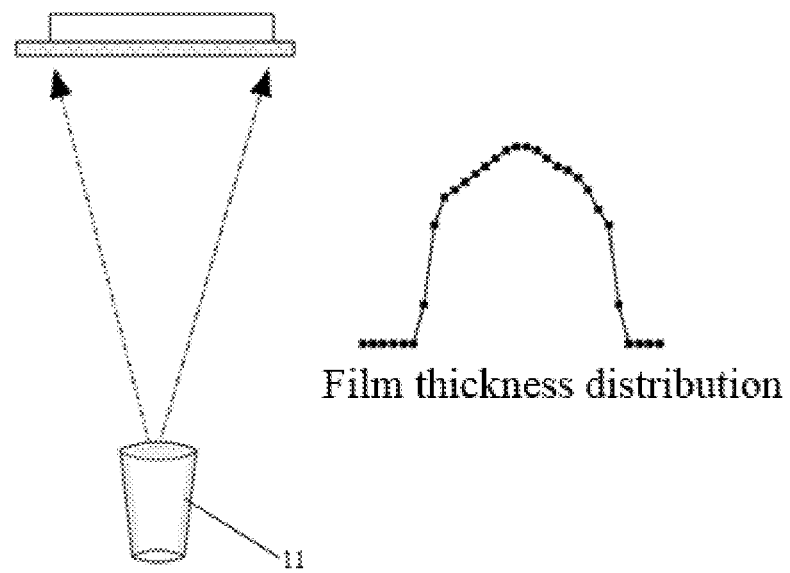
FIG. 27 illustrates a schematic diagram of a variation of a thickness of an evaporation film layer of an exemplary evaporation source consistent with disclosed embodiments of the present disclosure.

FIG. 27 illustrates a schematic diagram of a variation of a thickness of an evaporation film layer of an evaporation source consistent with disclosed embodiments of the present disclosure. In one embodiment, referring to FIG. 27, the evaporation film may have a thicker thickness in a center region, and may have a thinner thickness in an edge region.

Therefore, in the disclosed embodiments, referring to FIG. 25, the distance between two adjacent evaporation holes 12 in the third direction X1 may be set to be unequal.

Figure 28:
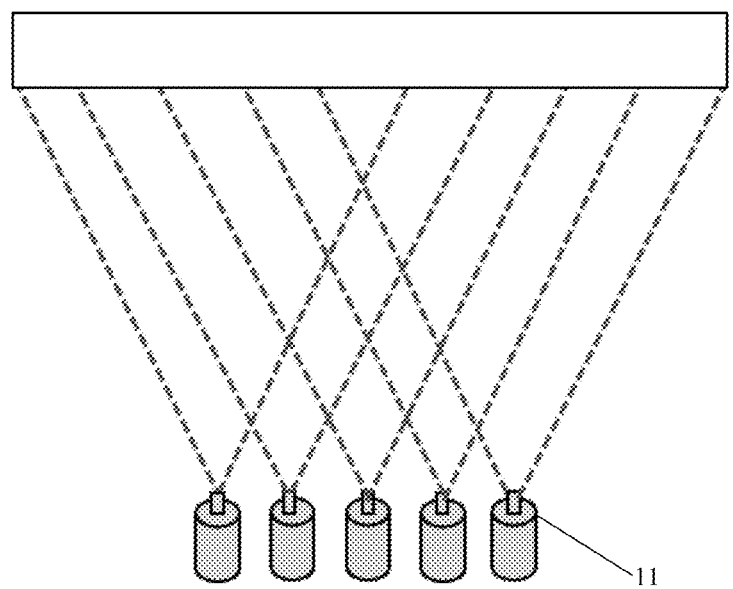
FIG. 28 illustrates a schematic diagram of a variation of an exemplary evaporation source consistent with disclosed embodiments of the present disclosure.

FIG. 28 illustrates a schematic diagram of a variation of an evaporation source consistent with disclosed embodiments of the present disclosure. Referring to FIG. 28, the adjacent evaporation sources 11 may be configured to perform vapor deposition on other edge region with thinner film thickness, to ensure the uniformity of the film thickness of the luminescent material, to improve the effective luminescent area of the luminescent material, and to sequentially improve the display performance of the display panel.

The display panel, the display device, and the evaporation device in the disclosed embodiments may have been introduced in detail. The principles and implementations of the present disclosure may be described with specific example. The descriptions of the above-disclosed embodiments may merely be used to facilitate understanding the present disclosure, which may not limit the scope of the present disclosure.

The various embodiments in the present disclosure are described in a progressive manner. Each embodiment mainly describes in terms of differences from other embodiments, and the same or similar parts between the various embodiments may be referred to each other.

It should be noted that the relational terms such as "first" and "second" are merely used to distinguish one entity or operation from another entity or operation, and do not necessarily require or imply any such actual relationship or sequence between these entities or operations. Moreover, the terms "include", "contain" or any variant may be intended to cover non-exclusive inclusion, such that a process, a method, an article, or a device that includes a series of elements may not only include such elements, but also include any other element that is not clearly listed, or may include elements inherent to such process, method, article or device. In a case without more restrictions, the element defined by the sentence "including . . . " may not exclude the existence of any other same element in the process, method, article, or device that includes the element.

The disclosed embodiments may have following beneficial effects. In the disclosed display panel, the first sub-pixels, the second sub-pixels and the third sub-pixels in each pixel unit may be arranged in a specific manner. The centers of the four first sub-pixels may form a virtual quadrilateral, and the centers of the two second sub-pixels and the centers of the two third sub-pixels may form a virtual isosceles trapezoid. The two second sub-pixels may be located on both ends of a diagonal of the virtual isosceles trapezoid, and the two third sub-pixels may be located on both ends of another diagonal of the virtual isosceles trapezoid. The interior of the virtual quadrilateral may include one second sub-pixel, and the interior of the virtual isosceles trapezoid may include one first sub-pixel. After the plurality of pixel units are arranged in an array, a new type of pixel arrangement manner may be formed. Such new type of pixel arrangement manner may reduce the problem of jaggedness when displaying an oblique line, and may achieve the close arrangement of sub-pixels. In other words, the PPI of the display panel may increase, and the display performance of the display panel may be improved.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:
1. A display panel, comprising:
a plurality of pixel units arranged in an array, wherein:
each pixel unit includes four first sub-pixels, two second sub-pixels, and two third sub-pixels,
centers of the two second sub-pixels and centers of the two third sub-pixels form a virtual isosceles trapezoid, wherein the two second sub-pixels are located on both ends of a diagonal of the virtual isosceles trapezoid, and the two third sub-pixels are located on both ends of another diagonal of the virtual isosceles trapezoid, and centers of the four first sub-pixels form a virtual quadrilateral, wherein an interior of the virtual quadrilateral includes one second sub-pixel of the two second sub-pixels, and an interior of the virtual isosceles trapezoid includes one first sub-pixel of the four first sub-pixels, wherein a shortest distance between a center of the one second sub-pixel and an intersection of diagonals of the virtual quadrilateral is a first preset distance, wherein the first preset distance is greater than zero.

2. The display panel according to claim 1, wherein:
in a first direction, a center of a second sub-pixel of the two second sub-pixels and a center of a third sub-pixel of the two third sub-pixels are located on two sides of a same virtual straight line, and
in a second direction, the center the second sub-pixel and a center of another third sub-pixel of the two third sub-pixels are located on another same virtual straight line, wherein the first direction is perpendicular to the second direction.

3. The display panel according to claim 2, wherein:
in the first direction, centers of two of the four first sub-pixels are located on a same virtual straight line, and
in the second direction, centers of two of the four first sub-pixels are located on another same virtual straight line.

4. The display panel according to claim 3, wherein:
a distance between the centers of two adjacent first sub-pixels in the first direction is L1, and a distance between the centers of two adjacent first sub-pixels in the second direction is L2, wherein L1=L2.

5. The display panel according to claim 2, wherein:
in the first direction, centers of two of the four first sub-pixels are located on a same virtual straight line, and
in the second direction, centers of two of the four first sub-pixels are located on both sides of another same virtual straight line.

6. The display panel according to claim 1, wherein:
a shortest distance between a center of the one first sub-pixel and an intersection of diagonals of the virtual isosceles trapezoid is a second preset distance, wherein the second preset distance is greater than zero, and
a shortest distance between a center of the one first sub-pixel and a midpoint of a mid-perpendicular line of the virtual isosceles trapezoid is a third preset distance, wherein the third preset distance is equal to zero.

7. The display panel according to claim 1, wherein:
in a same virtual isosceles trapezoid, a distance between a center of the one first sub-pixel and a center of one of the two second sub-pixels is L3, a distance between the center of the one first sub-pixel and a center of another one of the two second sub-pixels is L4, a distance between the center of the one first sub-pixel and a center of one of the two third sub-pixels is L5, and a distance between the center of the one first sub-pixel and a center of another one of the two third sub-pixels is L6, wherein L3=L4/L5≠L6.

8. The display panel according to claim 1, wherein:
in a same virtual isosceles trapezoid, a distance between a center of the one first sub-pixel and a center of one of the two second sub-pixels is L3, a distance between the center of the one first sub-pixel and a center of another one of the two second sub-pixels is L4, a distance between the center of the one first sub-pixel and a center of one of the two third sub-pixels is L5, and a distance between the center of the one first sub-pixel and a center of another one of the two third sub-pixels is L6, wherein L5=L6/L3≠L4.

9. The display panel according to claim 1, wherein:
in a same virtual isosceles trapezoid, a distance between a center of the one first sub-pixel and a center of one of the two second sub-pixels is L3, a distance between the center of the one first sub-pixel and a center of another one of the two second sub-pixels is L4, a distance between the center of the one first sub-pixel and a center of one of the two third sub-pixels is L5, and a distance between the center of the one first sub-pixel and a center of another one of the two third sub-pixels is L6, wherein L3≠L4≠L5≠L6.

10. The display panel according to claim 2, wherein:
in a same virtual isosceles trapezoid, a value of a length of a lower base minus a length of an upper base of the virtual isosceles trapezoid is in a range of approximately $$\frac{H}{32} - \frac{3H}{16}$$

including endpoint values, wherein H is a height of the virtual isosceles trapezoid.

11. The display panel according to claim 1, wherein:
a first sub-pixel of the four first sub-pixels is a red sub-pixel, a second sub-pixel of the two second sub-pixels is a green sub-pixel, and a third sub-pixel of the two third sub-pixels is a blue sub-pixel, or
the first sub-pixel is the red sub-pixel, the second sub-pixel is the blue sub-pixel, and the third sub-pixel is the green sub-pixel.

12. The display panel according to claim 1, wherein:
in a same virtual isosceles trapezoid, an angle between a lower base and a hypotenuse of the virtual isosceles trapezoid is in a range of approximately 83°-88° including endpoint values.

13. The display panel according to claim 2, wherein:
the second sub-pixel includes at least four corners, and the third sub-pixel includes at least four corners, and
in the second direction, at least one corner of the second sub-pixel and at least one corner of the third sub-pixel are located on a same virtual straight line.

14. The display panel according to claim 1, further including:
a substrate and one or more supporting pillars, wherein an orthographic projection of a supporting pillar of the one or more supporting pillars on a plane of the substrate at least partially overlaps an orthographic projection of a lower base of the virtual isosceles trapezoid on the plane of the substrate.

15. The display panel according to claim 14, wherein:
a shortest distance between the supporting pillar and a second sub-pixel of the two second sub-pixels located on one end of the lower base of the virtual isosceles trapezoid is L7, and a shortest distance between the supporting pillar and a third sub-pixel of the two third sub-pixels located on another end of the lower base of the virtual isosceles trapezoid is L8, wherein L7=L8, and/or an orthographic projection of another supporting pillar of the one or more supporting pillars on the plane of the substrate at least partially overlaps an orthographic projection of a hypotenuse of the virtual isosceles trapezoid on the plane of the substrate.

16. The display panel according to claim 2, wherein:
in the first direction or the second direction, adjacent two virtual isosceles trapezoids that share a same side have a same area.

17. A display device, comprising:
a display panel, including:
a plurality of pixel units arranged in an array, wherein:
each pixel unit includes four first sub-pixels, two second sub-pixels, and two third sub-pixels,
centers of the two second sub-pixels and centers of the two third sub-pixels form a virtual isosceles trapezoid, wherein the two second sub-pixels are located on both ends of a diagonal of the virtual isosceles trapezoid, and the two third sub-pixels are located on both ends of another diagonal of the virtual isosceles trapezoid,
centers of the four first sub-pixels form a virtual quadrilateral, wherein an interior of the virtual quadrilateral includes one second sub-pixel of the two second sub-pixels, and an interior of the virtual isosceles trapezoid includes one first sub-pixel of the four first sub-pixels, and
a shortest distance between a center of the one second sub-pixel and an intersection of diagonals of the virtual quadrilateral is a first preset distance, wherein the first preset distance is greater than zero.

18. An evaporation device, comprising:
an evaporation source, wherein the evaporation source includes a plurality of evaporation holes arranged in sequence along a third direction, and
a first angle plate and a second angle plate arranged on both sides of the evaporation source along a fourth direction, wherein:
the third direction is perpendicular to the fourth direction,
the evaporation source moves along the fourth direction, to perform a vapor deposition on a display panel, the display panel including:
a plurality of pixel units arranged in an array, wherein:
each pixel unit includes four first sub-pixels, two second sub-pixels, and two third sub-pixels,
centers of the two second sub-pixels and centers of the two third sub-pixels form a virtual isosceles trapezoid, wherein the two second sub-pixels are located on both ends of a diagonal of the virtual isosceles trapezoid, and the two third sub-pixels are located on both ends of another diagonal of the virtual isosceles trapezoid,
centers of the four first sub-pixels form a virtual quadrilateral, wherein an interior of the virtual quadrilateral includes one second sub-pixel of the two second sub-pixels, and an interior of the virtual isosceles trapezoid includes one first sub-pixel of the four first sub-pixels, and
a shortest distance between a center of the one second sub-pixel and an intersection of diagonals of the virtual quadrilateral is a first preset distance, wherein the first preset distance is greater than zero, and
the fourth direction is parallel to an upper base or a lower base of the virtual isosceles trapezoid.

19. The evaporation device according to claim 18, wherein:
distances between any two adjacent evaporation holes in the third direction are different,
in a first direction, a center of a second sub-pixel of the two second sub-pixels and a center of a third sub-pixel of the two third sub-pixels are located on two sides of a same virtual straight line,
in a second direction, the center the second sub-pixel and a center of another third sub-pixel of the two third sub-pixels are located on another same virtual straight line, wherein the first direction is perpendicular to the second direction, and
the third direction is perpendicular to the second direction.

* * * * *